(12) United States Patent
Hsu

(10) Patent No.: US 6,946,692 B1
(45) Date of Patent: Sep. 20, 2005

(54) INTERCONNECTION UTILIZING DIAGONAL ROUTING

(75) Inventor: Yu-Hao Hsu, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/904,566

(22) Filed: Nov. 16, 2004

(51) Int. Cl.[7] ............................................. H01L 23/52
(52) U.S. Cl. ...................... 257/211; 257/774; 257/776; 257/773
(58) Field of Search ................................ 257/774, 773, 257/776, 211

(56) References Cited

U.S. PATENT DOCUMENTS

| | | | |
|---|---|---|---|
| 5,204,542 A * | 4/1993 | Namaki et al. | ............. 257/315 |
| 5,591,998 A * | 1/1997 | Kimura et al. | ............. 257/306 |
| 6,262,487 B1 * | 7/2001 | Igarashi et al. | ............. 257/758 |
| 6,291,846 B1 * | 9/2001 | Ema et al. | ................. 257/296 |
| 6,546,540 B1 * | 4/2003 | Igarashi et al. | ............... 716/13 |

* cited by examiner

Primary Examiner—Jasmine Clark
(74) Attorney, Agent, or Firm—Winston Hsu

(57) ABSTRACT

An interconnection layout is provided. The interconnection layout includes a lower metal wiring layer (Metal_n) being drawn in a first direction; an upper metal wiring layer (Metal_n+1) being drawn in a 45-degree direction with respect to a second direction being normal to the first direction; and a first and second metal vias having different dimensions interposed between the lower metal wiring layer and the upper metal wiring layer for electrically connected the two metal wiring layers, and wherein the first metal via has the dimension that is larger than the dimension of the second metal via thereby compensating non-uniform current flowing through one of the two metal wiring layers.

4 Claims, 3 Drawing Sheets

US 6,946,692 B1

INTERCONNECTION UTILIZING DIAGONAL ROUTING

BACKGROUND OF INVENTION

1. Field of the Invention

The present invention relates to the fabrication of integrated circuits and, more particularly, to the technology for improving large-scale integration semiconductor performance through diagonal routing.

2. Description of the Prior Art

As known in the art, a chip's microscopic transistors are ordinarily wired together on a grid of right-angle interconnects—known, in fact, as "Manhattan routing" for their resemblance to city streets. When one electron path needs to cross another, it must first shift up or down to another wiring layer via a Z-axis interconnect—known, in fact, as a via.

Chipmakers have jumped technical hurdles and worked wonders to create smaller chips and shorter interconnects—moving from 0.18- to 0.13-micron to 90-nanometer process manufacturing. They have toiled to raise speed limits or grease the paths—moving from aluminum to copper to silicon-on-insulator (SOI), strained-silicon, and low-k-dielectric designs. But they are still taking the long way around—tracing the legs of a right triangle instead of the hypotenuse.

In traditional Manhattan architecture, each metal routing layer has a fixed direction in which the wires can be drawn. This is called the "preferred direction." The first layer has horizontal routing, and the subsequent layers have alternating vertical and horizontal routing. While there are automatic routing tools for printed circuit boards that can draw wires diagonally, these have not been used in chip design. This is because chip routing is far more complex, with huge numbers of elements integrated, in comparison to printed circuit board routing.

Since 2001, a consortium of processor and production-equipment makers (also known as "the X Initiative") has been determined to overcome this fundamental limitation—to give chip designers the choice of diagonal as well as horizontal and vertical wires or interconnects. They call this concept the X Architecture, and the chip using the X Architecture routing method—the X chip. Compared to a Manhattan version of the same design, the X chip required less wire length and fewer vias, hence lower manufacturing cost. However, there are still some obstacles to be overcome in order to obtain better performance of an integrated circuit (IC) routed by the X Architecture.

SUMMARY OF INVENTION

It is the primary object of the present invention to provide an improved interconnection structure or interconnect layout capable of improving performance and reliability.

According to one preferred embodiment of this invention, an interconnection layout is provided. The interconnection layout includes a lower metal wiring layer (Metal_n) being drawn in a first direction; an upper metal wiring layer (Metal_n+1) being drawn in a 45-degree direction with respect to a second direction being normal to the first direction; and a first and second metal vias having different dimensions interposed between the lower metal wiring layer and the upper metal wiring layer for electrically connected the two metal wiring layers, and wherein the first metal via has the dimension that is larger than the dimension of the second metal via thereby compensating non-uniform current flowing through one of the two metal wiring layers.

From one aspect of this invention, in accordance with another preferred embodiment, an interconnection structure is provided. The interconnection structure includes a lower metal wiring layer (Metal_n) being disposed in a Y-axis direction of a reference coordinate; an upper metal wiring layer (Metal_n+1) being disposed in a 45-degree direction with respect to an X-axis direction of the reference coordinate; and a plurality of metal vias having substantially the same dimension interposed between the lower metal wiring layer and the upper metal wiring layer for electrically connected the two metal wiring layers, wherein the metal vias are aligned in one row, and wherein the metal vias are arranged denser at one end of the row while looser at the other end of the row.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 3:
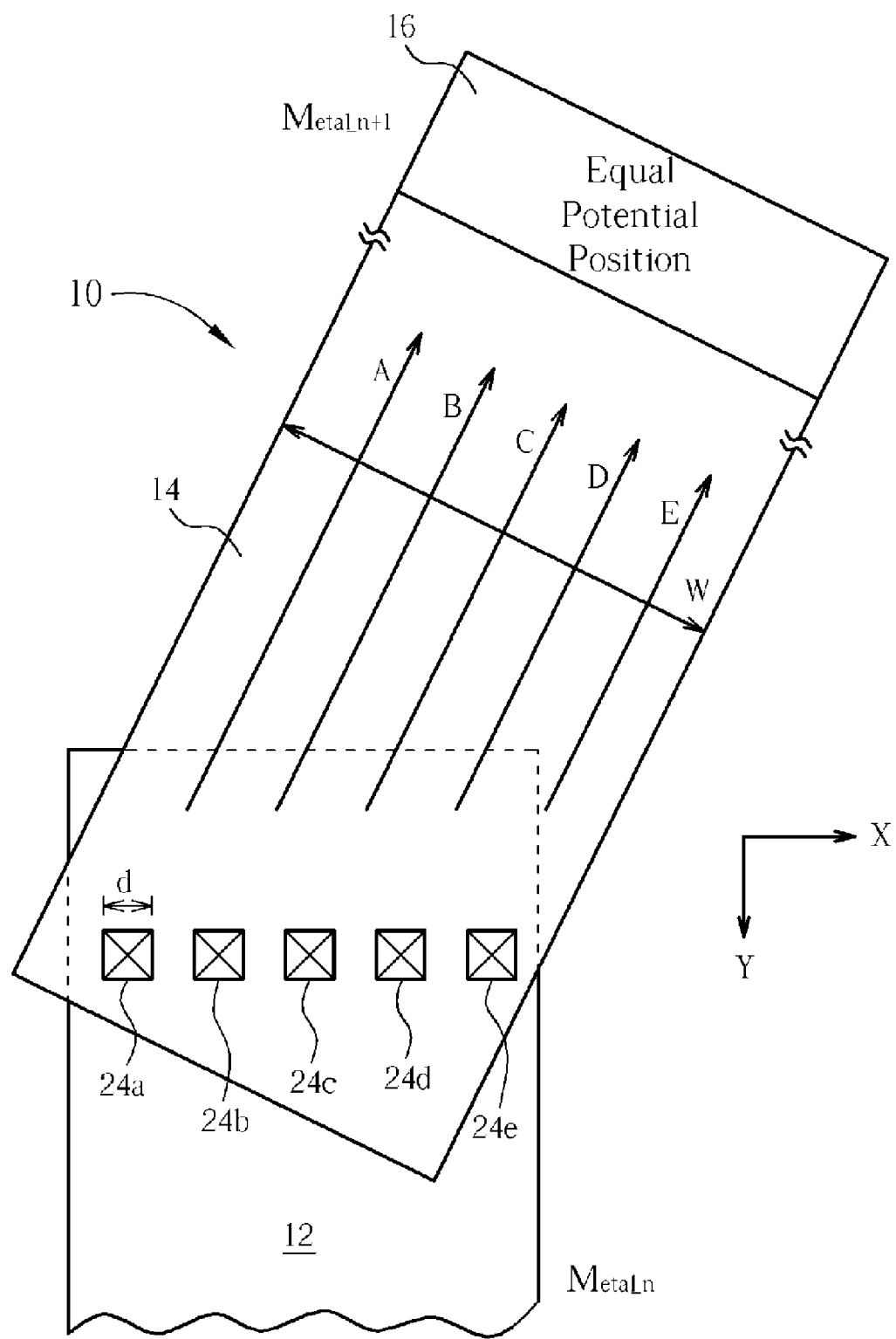
FIG. 3 is a plan view illustrating an enlarged part of a routing layout of a typical metal interconnection of an IC based on the X Architecture.

Please refer to FIG. 3. FIG. 3 is a plan view illustrating a part of a routing layout of a typical metal interconnection of an IC based on the X Architecture. As seen in FIG. 3, the interconnection structure 10 comprises a lower metal wiring layer 12 (denoted by "Metal_n", wherein "n" represents the layer/level of the lower metal wiring layer 12 within the IC) being drawn in vertical direction or Y-axis direction of the reference coordinate of FIG. 3, an upper metal wiring layer 14 (denoted by "Metal_n+1") being drawn in a 45-degree direction (diagonal direction) with respect to the horizontal direction (i.e., the X-axis direction of the reference coordinate), and a plurality of metal vias 24a~24e having substantially the same dimension "d" and the same design rules (such as spacing or pitch). The metal vias 24a~24e are interposed between the lower metal wiring layer (Metal_n) 12 and the upper metal wiring layer (Metal_n+1) 14 for electrically connected the two metal wiring layers. It is to be understood that the inter-metal dielectrics are not shown for the sake of simplicity.

In operation, the upper metal wiring layer 14 is typically coupled to an equal electric potential such that an electron current may flow from the lower metal wiring layer 12, through the metal vias 24a~24e and the upper metal wiring layer 14 to the equal electric potential position 16, and vice versa. However, one of the shortcomings of the above-described interconnection structure 10 is that the current flowing through the metal wiring layers is not uniform across the width "W" of the metal wiring layer 14.

To explain this non-uniform current phenomenon, still referring to FIG. 3, five different paths: A, B, C, D, and E corresponding to the five metal vias 24a~24e, respectively, are illustrated. Since Path A between the equal potential position 16 and via 24a is longest, it thus has largest routing resistance than any other paths. In theory, the routing resistance of the upper metal wiring layer (Metal_n+1) 14 is in the order of: Path A>Path B>Path C>Path D>Path E. This forces the electron current to flow through the path with relatively lower resistance, i.e., Path E in this exemplary case, thus posing problems such as signal delay and reduced performance and reliability.

Accordingly, the present invention is addressed to a method or a rule and a novel structure that is capable of solving or alleviating the above-described non-uniform current phenomenon when applying the X Architecture routing method to the fabrication of metal interconnections of ICs, thereby improving reliability and performance. Ordinarily, the aforesaid non-uniform current phenomenon occurs at the interface between the first diagonal metal wiring layer ("X Architecture" layer; usually metal layer 4 or layer 5 of a 8- or 9-layer metal interconnection) and the metal layer underneath the first diagonal metal wiring layer (the uppermost "Manhattan layer"; usually metal layer 3 or layer 4, but not limited thereto).

Figure 1:
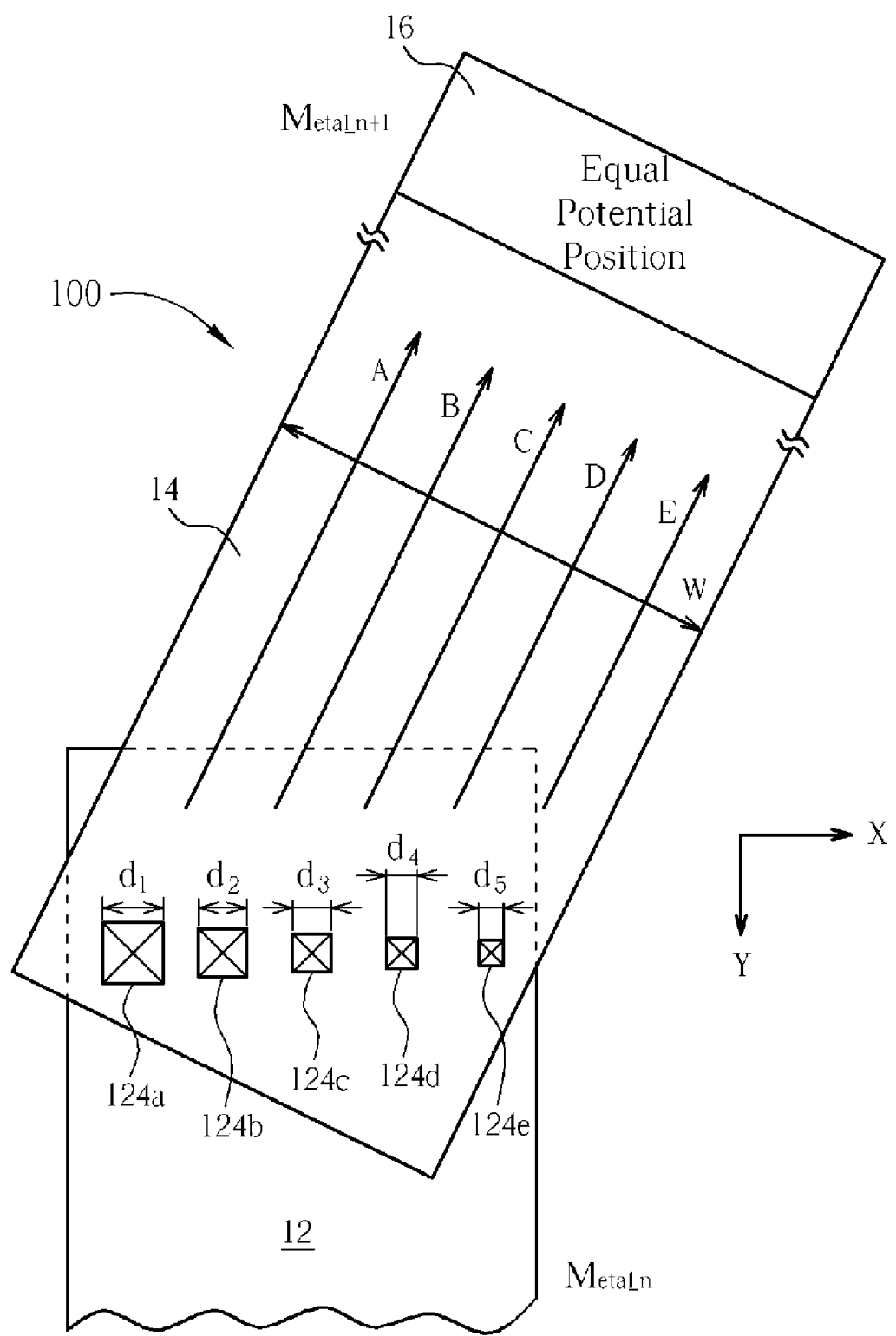
FIG. 1 is a plan view illustrating an enlarged part of a routing layout of a metal interconnection of an IC utilizing the X Architecture and Manhattan layout in accordance with one preferred embodiment of the present invention.

Please now refer to FIG. 1. FIG. 1 is a plan view illustrating a part of a routing layout of a metal interconnection 100 of an IC utilizing the X Architecture (starting from metal layer (n+1)) and Manhattan layout (from metal layer 1 to metal layer (n), for example, n=3) in accordance with one preferred embodiment of the present invention. For the sake of simplicity, the inter-metal dielectrics are omitted. As shown in FIG. 1, likewise, the interconnection structure 100 comprises a lower metal wiring layer 12 (Metal_n) being drawn in Y-axis direction of the reference coordinate, an upper metal wiring layer (Metal_n+1) 14 being drawn in a 45-degree direction (diagonal direction) with respect to the X-axis direction of the reference coordinate, and a row of metal vias 124a~124e having different dimensions. The metal vias 124a~124e, which are aligned in one row from a left side to the right side of the lower metal wiring layer (Metal_n) 12, are interposed between the lower metal wiring layer (Metal_n) 12 and the upper metal wiring layer (Metal_n+1) 14 for electrically connected the two metal wiring layers. It is to be understood that the metal vias 124a~124e may rotate a 45-degree angle.

According to this preferred embodiment, the metal vias 124a~124e are rectangular shaped on the layout diagram. Compared to the metal vias as set forth in FIG. 3, the metal vias 124a~124e have been resized to compensate the non-uniform current phenomenon. Since the routing resistance of the upper metal wiring layer (Metal_n+1) 14 is in the order of: Path A>Path B>Path C>Path D>Path E, the dimension $d_1$ of the metal via 124a is therefore the largest than any other vias on its right side. The second largest via dimension is metal via 124b and so forth from the left side to the right side of the lower metal wiring layer (Metal_n) 12. As specifically indicated in FIG. 1, the dimensions of the metal vias 124a~124e are denoted by $d_1$~$d_5$, respectively, and are in the order of: $d_1>d_2>d_3>d_4>d_5$. Since the dimension of the metal via 124a is largest, more current flows through it when in operation, thereby balancing the current across the width W of the upper metal wiring layer (Metal_n+1) 14. The resistance difference between the paths is compensated.

Figure 2:
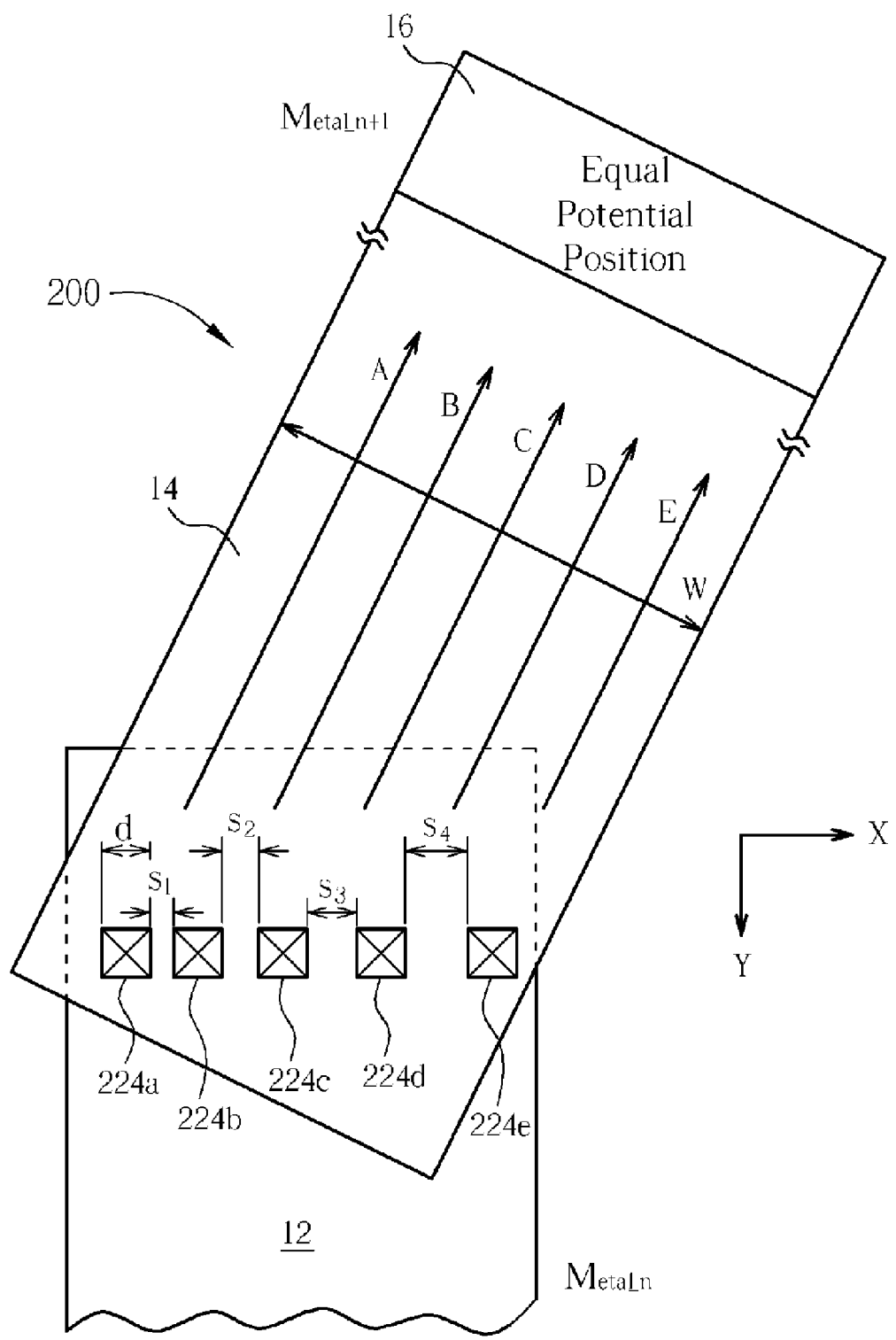
FIG. 2 is a plan view illustrating a part of a routing layout of a metal interconnection of an IC utilizing the X Architecture (starting from metal layer (n+1)) in accordance with another preferred embodiment of the present invention.

FIG. 2 is a plan view illustrating a part of a routing layout of a metal interconnection 200 of an IC utilizing the X Architecture (starting from metal layer (n+1)) in accordance with another preferred embodiment of the present invention. The inter-metal dielectrics are omitted. As shown in FIG. 2, the interconnection structure 200 comprises a lower metal wiring layer 12 (Metal_n) disposed in Y-axis direction of the reference coordinate, an upper metal wiring layer 14 (Metal_n+1) disposed in a 45-degree direction (diagonal direction) with respect to the X-axis direction of the reference coordinate, and a plurality of metal vias 224a~224e having substantially the same dimension: d. The metal vias 224a~224e, which are aligned in one row from a left side to the right side of the lower metal wiring layer (Metal_n) 12, are interposed between the lower metal wiring layer (Metal_n) 12 and the upper metal wiring layer (Metal_n+1) 14 for electrically connected the two metal wiring layers.

According to this preferred embodiment, the metal vias 224a~224e are rectangular shaped on the layout diagram, but not limited thereto. Compared to the metal vias as set forth in FIG. 3, the metal vias 224a~224e have been rearranged to compensate the non-uniform current phenomenon. The spacing between the metal via 224a and metal via 224b is denoted by $S_1$, the spacing between the metal via 224b and metal via 224c is denoted by $S_2$, spacing between the metal via 224c and metal via 224d is denoted by $S_3$, and the spacing between the metal via 224d and metal via 224e is denoted by $S_4$. Since the routing resistance of the upper metal wiring layer (Metal_n+1) 14 is in the order of: Path A>Path B>Path C>Path D>Path E, the spacing $S_1$ between the metal via 224a and metal via 224b is therefore the smallest. In other words, the metal vias are arranged denser to allow more current to pass Path A or B. As specifically indicated in FIG. 2, the spacing of the metal vias 224a~224e is in the order of: $S_1<S_2<S_3<S_4$.

In still another preferred embodiment, there may be a second row of metal vias that is parallel with the row of metal vias 224a~224e and are analogically arranged in a dense to loose manner as metal vias 224a~224e.

Those skilled in the art will readily observe that numerous modification and alterations of the invention may be made while retaining the teachings of the invention. Accordingly, the above disclosure should be construed as limited only by the metes and bounds of the appended claims.

What is claimed is:

1. An interconnection layout comprising:
   a lower metal wiring layer (Metal_n) being drawn in a first direction;
   an upper metal wiring layer (Metal_n+1) being drawn in a 45-degree direction with respect to a second direction being normal to the first direction; and
   a first and second metal vias having different dimensions interposed between the lower metal wiring layer and the upper metal wiring layer for electrically connected the two metal wiring layers, and wherein the first metal via has the dimension that is larger than the dimension of the second metal via thereby compensating non-uniform current flowing through one of the two metal wiring layers.

2. The interconnection layout according to claim 1 wherein the first and second metal vias have a rectangular shaped section.

3. The interconnection layout according to claim 1 wherein the upper metal wiring layer has an equal electric position, and wherein distance between the first metal via and the equal electric position is longer than distance between the second metal via and the equal electric position.

4. An interconnection structure comprising:
a lower metal wiring layer (Metal_n) being disposed in a Y-axis direction of a reference coordinate;
an upper metal wiring layer (Metal_n+1) being disposed in a 45-degree direction with respect to an X-axis direction of the reference coordinate; and
a plurality of metal vias having substantially the same dimension interposed between the lower metal wiring layer and the upper metal wiring layer for electrically connected the two metal wiring layers, wherein the metal vias are aligned in one row, and wherein the metal vias are arranged denser at one end of the row while looser at the other end of the row.

* * * * *